US006807083B2

(12) United States Patent
Yamamura

(10) Patent No.: US 6,807,083 B2
(45) Date of Patent: Oct. 19, 2004

(54) FERROELECTRIC MEMORY DEVICE

(75) Inventor: Mitsuhiro Yamamura, Suwa (JP)

(73) Assignee: Seiko Epson Corporation, Tokyo (JP)

(*) Notice: Subject to any disclaimer, the term of this patent is extended or adjusted under 35 U.S.C. 154(b) by 56 days.

(21) Appl. No.: 10/393,439

(22) Filed: Mar. 20, 2003

(65) Prior Publication Data

US 2003/0223266 A1 Dec. 4, 2003

(30) Foreign Application Priority Data

Mar. 22, 2002 (JP) ........................................ 2002-081188

(51) Int. Cl.[7] .............................................. G11C 7/00
(52) U.S. Cl. .................... 365/145; 365/189.09
(58) Field of Search ........................... 365/145, 189.06, 365/226

(56) References Cited

U.S. PATENT DOCUMENTS 5,602,784 A * 2/1997 Kojima et al. ......... 365/189.09

2004/0071018 A1 * 4/2004 Nordal et al. ............... 365/200

FOREIGN PATENT DOCUMENTS

JP          09-116107          5/1997

* cited by examiner

*Primary Examiner*—Vu A. Le
(74) *Attorney, Agent, or Firm*—Hogan & Hartson, LLP

(57) ABSTRACT

A plurality of word lines and a plurality of bit lines are disposed on opposite sides of a ferroelectric thin film, and each memory cell is formed by one ferroelectric capacitor. The word lines and the bit lines are driven by a word line driver section and a bit line driver section to which a plurality of types of drive voltages are supplied from a power supply circuit, and each operation mode including writing, reading, and rewriting of data is performed. A short-circuiting circuit is connected with the end portions of the word lines and the bit lines. The short-circuiting circuit short-circuits all the word lines and the bit lines after the operation mode, when turning the power on, or when turning the power off.

16 Claims, 17 Drawing Sheets

FIG. 5 SHORT CIRCUITED STATE AFTER READ, WRITE, AND REWRITE

FERROELECTRIC MEMORY DEVICE

Japanese Patent Application No. 2002-81188 filed on Mar. 22, 2002, is hereby incorporated by reference in its entirety.

BACKGROUND OF THE INVENTION

The present invention relates to a ferroelectric memory device.

As one type of ferroelectric memory device, an active ferroelectric memory device having 1T/1C cells in which one transistor and one capacitor (ferroelectric) are disposed in each cell or 2T/2C cells in which reference cells are further disposed in each cell is known.

However, the memory area of the active ferroelectric memory device is increased in comparison with a flash memory or an EEPROM known as a nonvolatile memory device in which a memory cell is formed by one element, whereby an increase in capacity cannot be achieved.

Japanese Patent Application Laid-open No. 9-116107 discloses a ferroelectric memory device in which each memory cell is formed by one ferroelectric capacitor.

BRIEF SUMMARY OF THE INVENTION

A ferroelectric memory device in which each memory cell is formed by one ferroelectric capacitor has problems which must be solved for putting the ferroelectric memory device to practical use, such as a decrease in power consumption, an increase in drive speed, and problems occurring when turning the power on or off. The present invention may solve these problems.

A ferroelectric memory device according to the present invention comprises:

a plurality of word lines disposed in parallel;

a plurality of bit lines disposed in parallel so as to intersect the word lines;

a plurality of ferroelectric memory cells disposed at intersecting points of the word lines and the bit lines;

a word line driver section which drives the word lines;

a bit line driver section which drives the bit lines;

a first circuit which supplies a plurality of types of drive voltages to the word line driver section and the bit line driver section; and a second circuit which is connected with end portions of the word lines and end portions of the bit lines, the second circuit short-circuiting all of the word lines and the bit lines.

According to the present invention, an equalize operation must be performed for a plurality of ferroelectric capacitors formed at each intersecting point of the word lines and the bit lines by setting electrodes of the word lines and the bit lines at the same potential after writing, reading, or rewriting data. If the equalize operation is performed using the second circuit, the equalize operation can be realized by utilizing charging and discharging of the word lines and the bit lines, whereby power consumption is decreased. This also enables the word lines and the bit lines to be precharged for the next operation mode by utilizing charging and discharging of the word lines and the bit lines.

A memory cell array in which the ferroelectric memory cells are arranged may be divided into a plurality of blocks, the word line driver section, the bit line driver section, and the second circuit being disposed in each of the blocks.

The short-circuit operation may be performed after writing data for which an increase in speed is comparatively unnecessary. If the word lines and the bit lines are short-circuited when turning the power on or when turning the power off, application of an unexpected voltage to the ferroelectric capacitor due to indetermination of transistors in the word line driver and the bit line driver or the first circuit can be prevented when turning the power on.

The second circuit may be directly connected with the end portions (one end portion or both end portions) of the word lines and the bit lines. This prevents occurrence of adverse effects caused by noise or an unexpected event due to indetermination of transistors during the short-circuit operation, since the transistors in the word line driver and the bit line driver or the first circuit are not interposed between the memory cell array and the second circuit. Therefore, a stable short-circuit operation can be secured. Moreover, since load capacitance to be connected is reduced due to a decrease in the length of a short-circuit path, the speed of the short-circuit operation is increased.

Before performing the short-circuit operation, potentials of the word line and the bit line selected during the operation mode may be predriven by the word line driver and the bit line driver so as to be close to a potential of the nonselected word lines or the nonselected bit lines. Since the number of selected word lines and selected bit lines is smaller than the number of nonselected word lines and nonselected bit lines, load capacitance connected with the selected word line and the selected bit line is small. Therefore, the charge and discharge speed of the selected word line and the selected bit line is comparatively high. If the word lines and the bit lines having different charge and discharge speeds are collectively short-circuited, an unexpected event may occur since the behavior of charge transfer cannot be estimated. Therefore, the selected word line and the selected bit line having a high charge and discharge speed are predriven before the short-circuit operation so that the potential of the selected word line and bit line are close to the potential of the nonselected word lines or the nonselected bit lines having a low charge and discharge speed.

When turning the power on, a plurality of short-circuit switches may be turned on for a predetermined period in the rise of a power supply potential immediately after turning the power on. When turning the power off, a plurality of short-circuit switches may be turned on for a predetermined period including a period after the power is turned off. This prevents application of an unexpected voltage to the ferroelectric capacitor by equalizing the word lines and the bit lines during a period in which the transistors in the word line driver and the bit line driver or the first circuit are indeterminate.

In order to realize the short-circuit operation when turning the power on and when turning the power off, a plurality of first short-circuit switches each connected between a common short-circuit line and one of among the word lines and the bit lines may be provided, and a plurality of second short-circuit switches may be provided in parallel to the respective first short-circuit switches. The first short-circuit switches may be turned on by a first control signal when turning the power on, and the second short-circuit switches may be turned on by a second control signal when turning the power off.

The short-circuit operation may equalize the word lines and the bit lines at a grounding potential by grounding the common short-circuit line. This enables a more stable equalize effect to be obtained by grounding the word lines and the bit lines by the short-circuit operation when turning the power on or when turning the power off due to the absence of residual charges.

The present invention may be suitably applied to a cross point or passive ferroelectric memory device in which each of the ferroelectric memory cells formed at intersecting points of the word lines and the bit lines is formed by only a ferroelectric capacitor.

DETAILED DESCRIPTION OF THE EMBODIMENTS

Figure 1:
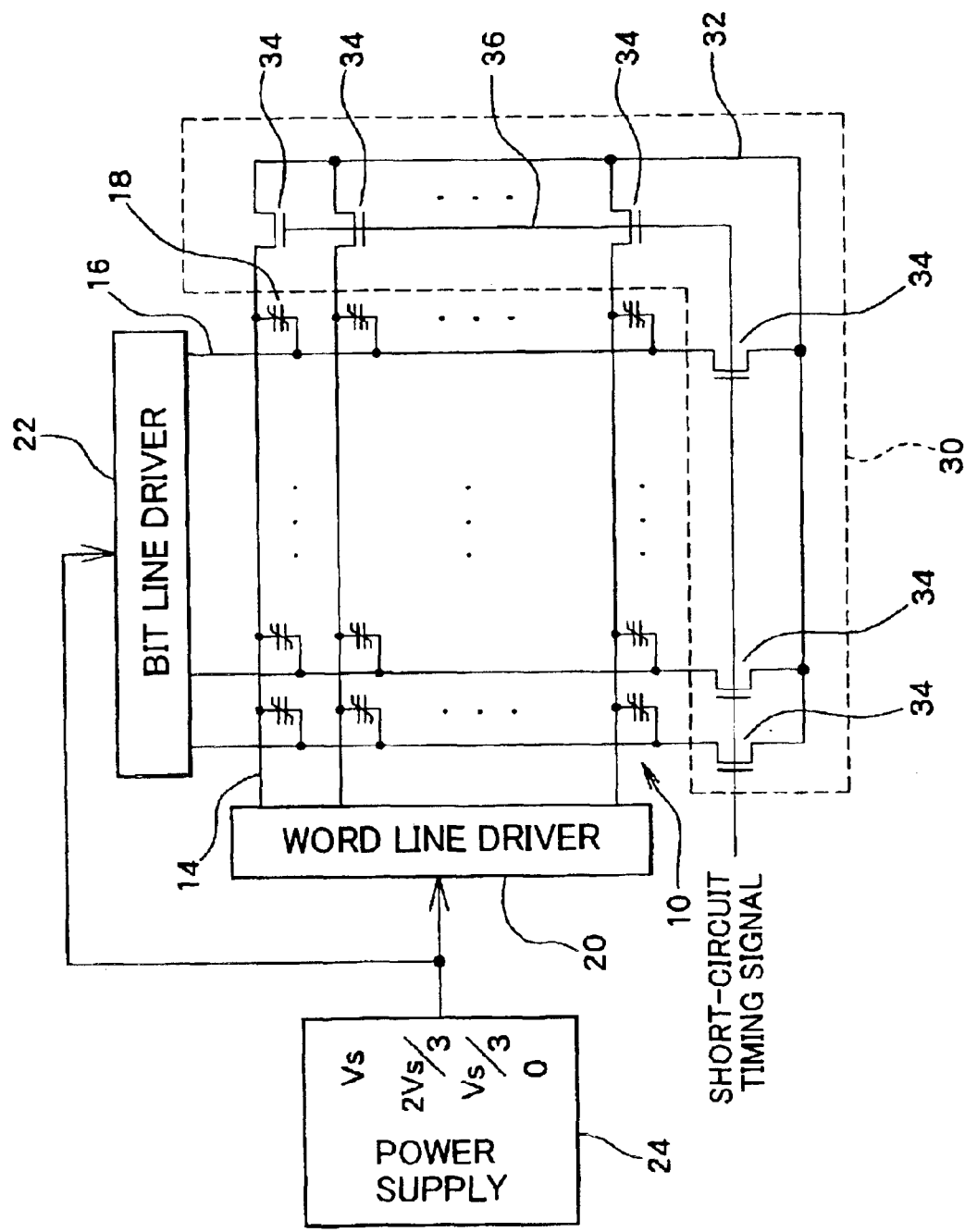
FIG. 1 is a schematic explanatory diagram of a ferroelectric memory device according to a first embodiment of the present invention.
Figure 2:
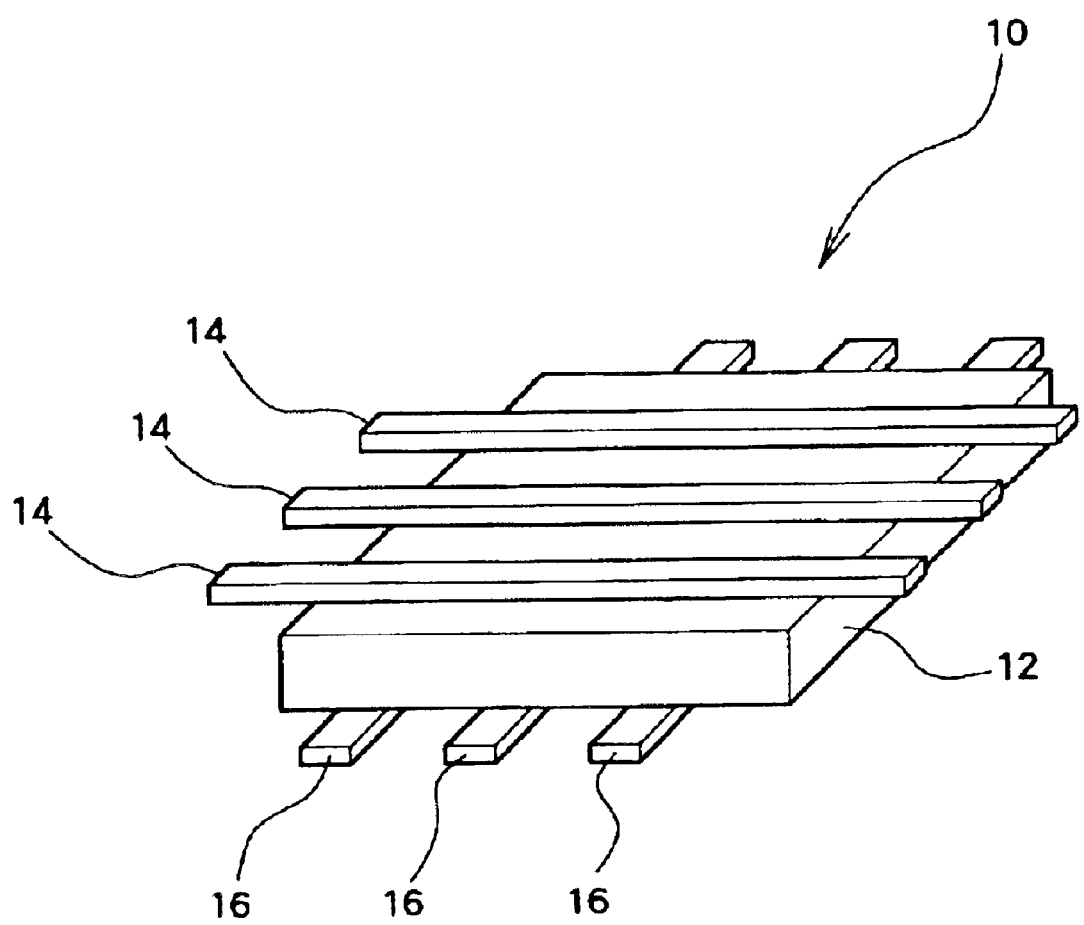
FIG. 2 is a schematic perspective diagram of a memory cell array shown in FIG. 1.

Embodiments of the present invention are described below in detail with reference to the drawings.
First Embodiment
Configuration FIG. 1 is block diagram of a ferroelectric memory device (FeRAM) according to a first embodiment of the present invention. FIG. 2 is a perspective view schematically showing a memory cell array of the FeRAM. As shown in FIG. 2, a memory cell array 10 includes a ferroelectric thin film 12, a plurality of word lines 14 arranged on one side of the ferroelectric thin film 12, and a plurality of bit lines 16 arranged on the other side of the ferroelectric thin film 12.

As shown in FIG. 1, ferroelectric memory cells 18 are formed at each intersecting point (cross point) of the word lines 14 and the bit lines 16. Therefore, the memory shown in FIG. 2 is called a cross point FeRAM or a passive FeRAM. Therefore, the memory shown in FIG. 2 differs from an active memory having 1T/1C cells in which one transistor and one capacitor (ferroelectric) are disposed in each cell or 2T/2C cells in which reference cells are further disposed in each cell.

In the FeRAM of the present embodiment, it is unnecessary to provide a transistor in the memory cell array 10, whereby the degree of integration can be increased. The structure shown in FIG. 2 can be stacked in a plurality of stages. A driver circuit board on which a CMOS logic is mounted may be disposed under the structure shown in FIG. 2, for example.

As the ferroelectric material used in the present embodiment, an inorganic material such as SBT (strontium-bismuth-tantalum), PZT (read-zirconium-titanium), BLT (bismuth-lanthanum-titanium), or oxides of these compounds is suitably used. Another inorganic material or organic material may also be used.

As the electrode material for forming the word lines 14 and the bit lines 16 used in the present embodiment, platinum (Pt), iridium (Ir), iridium oxide ($IrO_2$), strontium-ruthenium, or strontium-ruthenium oxide is suitably used, since these materials have high oxidation resistance and high heat resistance. The electrode material may be another conductive material.

As a driver circuit system for the memory cell array 10, a word line driver 20 which drives the word lines 14, a bit line driver 22 which drives the bit lines 16, and a power supply circuit 24 which supplies a plurality of types of drive voltages (Vs, 2Vs/3, Vs/3, and 0) to the word line driver 20 and the bit line driver 22 are provided. The word line driver 20 is connected with one end (left end in FIG. 1) of each of the word lines 14, and the bit line driver 22 is connected with one end (top end in FIG. 1) of each of the bit lines 16.

The word line driver 20 includes a row address decoder and supplies potentials corresponding to a read, write, or rewrite mode (corresponding to data to be written when writing or rewriting) to one selected word line 14 and the remaining nonselected word lines 14. The bit line driver 22 includes a column address decoder and supplies potentials corresponding to the read, write, or rewrite mode (corresponding to data to be written when writing or rewriting) to at least one selected bit line 16 and the remaining nonselected bit lines 16.

In the present embodiment, a short-circuiting circuit 30 which short-circuits all of the word lines 14 and the bit lines 16 is further provided. The short-circuiting circuit 30 is connected with the other end of each of the word lines 14 and the bit lines 16.

One short-circuiting circuit 30 may be provided to the ends of all the word lines 14 and the bit lines 16 of the ferroelectric memory device. The memory cell array 10 may be divided into a plurality of blocks and the short-circuiting circuit may be provided for each of the blocks. In this case, the word line driver 20 and the bit line driver 22 are provided for each of the blocks.

The short-circuiting circuit 30 shown in FIG. 1 has a common short-circuit line 32. The short-circuiting circuit 30 includes a plurality of short-circuit switches 34 connected between the other end of each of the word lines 14 and the bit lines 16 and the common short-circuit line 32. Each of the short-circuit switches 34 is formed by an N-type MOS transistor and turned on or off at the same time by a common gate line 36, for example.

Operation

Figure 3:
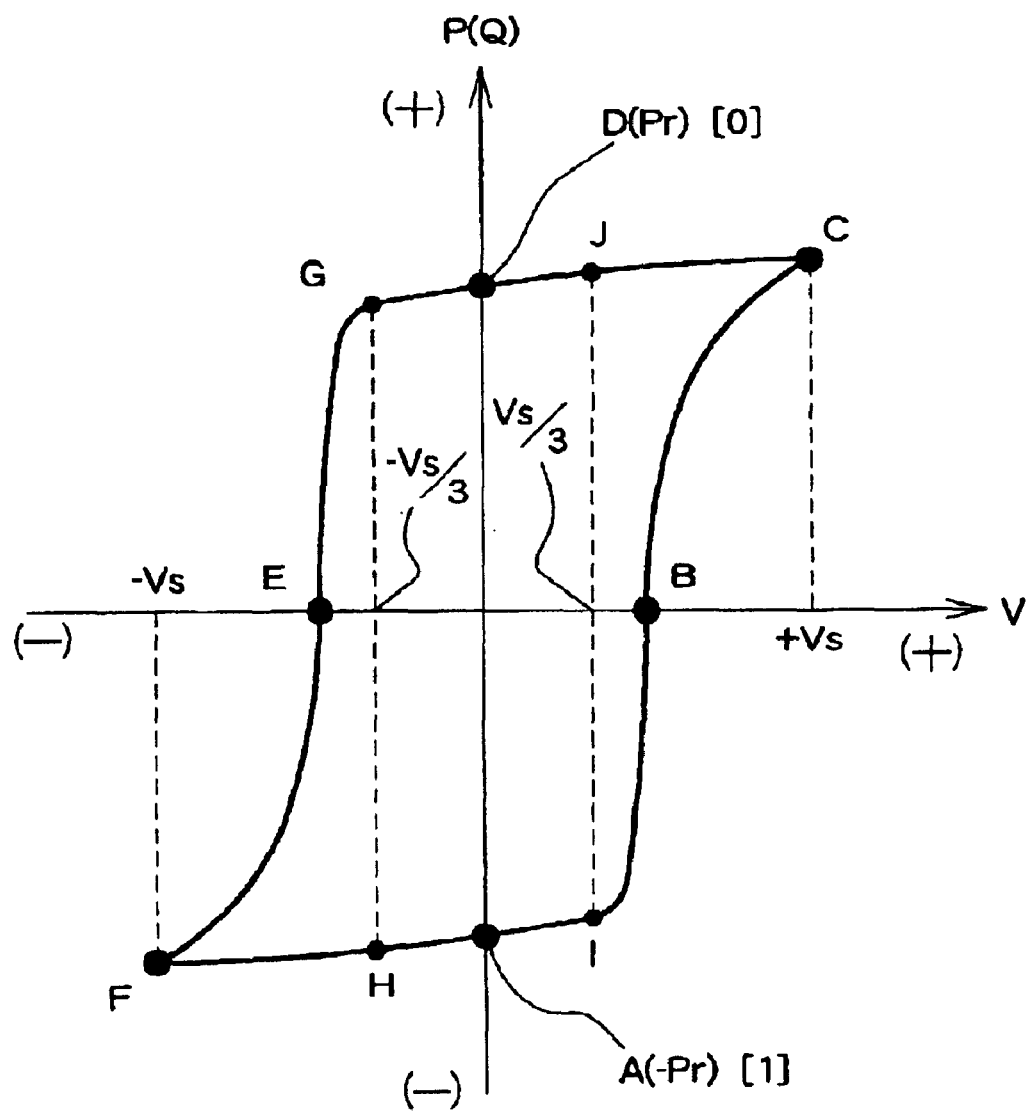
FIG. 3 is a P-V or Q-V hysteresis curves of a ferroelectric memory cell shown in FIG. 1.

The operations of the FeRAM shown in FIG. 1 are described below. FIG. 3 shows P-V or Q-V hysteresis curves by voltage dependency of spontaneous polarization P or polarization Q (change of polarization P×capacitor area) of the memory cell 18 shown in FIG. 1.

In FIG. 3, the direction in which the potential of the word line 14 becomes higher than the potential of the bit line 16 is positive (+), for example. The voltage applied to the memory cell 18 is 0 V when the word line 14 and the bit line 16 are at the same potential (including a power off state in which the word line 14 and the bit line 16 are at 0 V). The ferroelectric capacitor has two types of remanent polarization ±Pr (points A and D in FIG. 3) when the voltage applied to the memory cell 18 is 0 V. If the remanent polarization Pr at the point D in FIG. 3 is defined as a memory state of "0" and the remanent polarization −Pr at the point A in FIG. 3 is defined as a memory state of "1", two values of memory state can be obtained.

Points C and F in FIG. 3 are saturation polarization points of the ferroelectric memory cell 18. Points B and E in FIG. 3 are points at which the polarization direction is inverted. The voltage at which the polarization value is 0, such as the point B or E, is called a coercive voltage.

According to the P-V or Q-V hysteresis curves in FIG. 3, when writing data "0", the polarization of the ferroelectric memory cell 18 is switched to the point C in FIG. 3 by applying a voltage Vs to the ferroelectric memory cell 18, and switched to the point D by applying 0 V to the ferroelectric memory cell 18. When writing data "1", the polarization of the ferroelectric memory cell 18 is switched to the point F in FIG. 3 by applying a voltage −Vs to the ferroelectric memory cell 18, and switched to the point A by applying 0 V to the ferroelectric memory cell 18.

Data is read from the ferroelectric memory cell 18 by applying the voltage +Vs to the ferroelectric memory cell 18 which is in a polarization state at the point A or D.

Even if the remanent polarization of a selected cell 18*a* is at the point A or D in FIG. 3, the selected cell 18*a* is switched to a polarization state at the point C in FIG. 3 by the read operation. In the case where the polarization of the selected cell 18*a* is switched from the point A to the point C (reading of memory state "1"), the polarization direction is inverted from negative to positive across the point B at which the polarization value is 0. Therefore, a comparatively large amount of current corresponding to a comparatively large amount of charge Q1 shown in FIG. 3 flows through the bit line 16. In the case where the polarization of the selected cell 18*a* is switched from the point D to the point C (reading of memory state "0"), the polarization direction is not changed and only the amount of polarization is changed. Therefore, a comparatively small amount of current corresponding to a comparatively small amount of charge Q2 shown in FIG. 3 flows through the bit line 16. Therefore, the memory state can be judged as either "1" or "0" by comparing the current flowing through the bit line 16 with a reference current (not shown).

The potential setting of the word line 14 and the bit line 16 is described below taking reading of data as an example. The potentials are set by the word line driver 20 and the bit line driver 22 to which the four types of potentials (Vs, 2Vs/3, Vs/3, and 0) are supplied from the power supply circuit 24. The potentials Vs and 0 are two types of select potentials and the potentials 2Vs/3 and Vs/3 are two types of nonselect potentials. All the short-circuit switches 34 of the short-circuiting circuit 30 are turned off when reading data.

Figure 4:
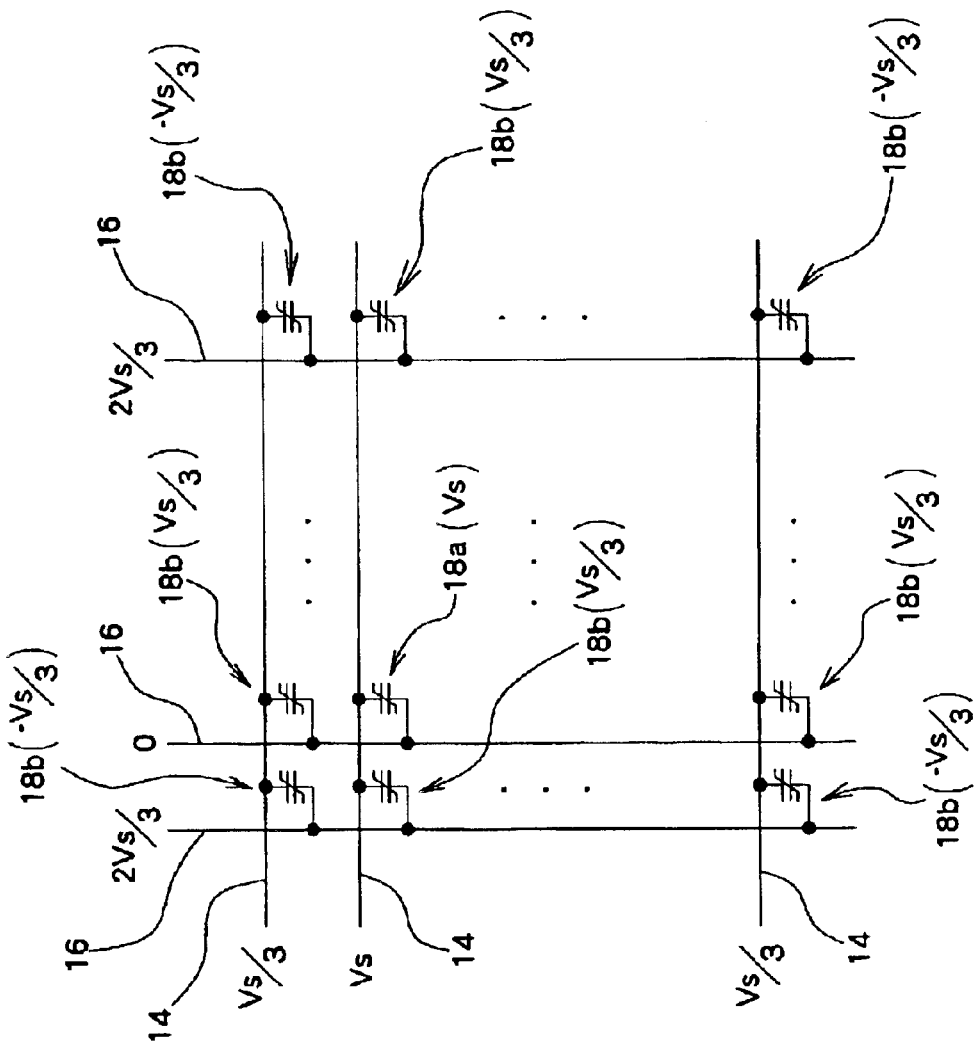
FIG. 4 is a schematic explanatory diagram showing potential setting of word lines and bit lines of a ferroelectric memory cell array when reading (when writing data "0")

In FIG. 4, one selected cell 18*a* and other nonselected cells 18*b* are illustrated. The word line 14 and the bit line 16 connected with the selected cell 18*a* located at an address (2,2) are respectively set at the potential Vs (word select potential) and the potential 0 (bit select potential). Therefore, a positive electric field of Vs−0=Vs is applied to the selected cell 18*a*. Therefore, even if the remanent polarization of the selected cell 18*a* is at the point A or D in FIG. 3, the selected cell 18*a* is switched to a polarization state at the point C in FIG. 3 by the read operation. Therefore, the memory state can be judged as either "1" or "0" by detecting the current flowing through the bit line 16 connected with the selected cell 18*a*.

The case of setting the polarization state at the point C in FIG. 3 is the same as the write operation of data "0". Therefore, the potentials are set as shown in FIG. 4 when writing data "0".

The actual data read operation is performed for the memory cells 18 connected with one word line 14 at the same time, whereby a data group such as 8 bits or 16 bits of data is read at the same time.

When reading data, all the word lines 14 connected with the nonselected cells 18*b* shown in FIG. 4 are set at the potential Vs/3 (word nonselect potential), and all the bit lines 16 connected with the nonselected cells 18*b* are set at the potential 2Vs/3 (bit nonselect potential). Therefore, the voltage applied to the nonselected cells 18*b* is ±Vs/3. As a result, the polarization of the nonselected cells 18*b* which are in a polarization state at the point A is switched to either the point H or I in FIG. 3. Since the polarization does not cross the inversion point B even if the polarization is switched from the point A to the point I, stored data is not inverted. The polarization of the nonselected cells 18*b* which are in a polarization state at the point D is switched to either the point G or J in FIG. 3. In this case, since the polarization does not cross the inversion point E even if the polarization is switched from the point D to the point G, stored data is not inverted.

Short-circuit Operation after Reading

Figure 5:
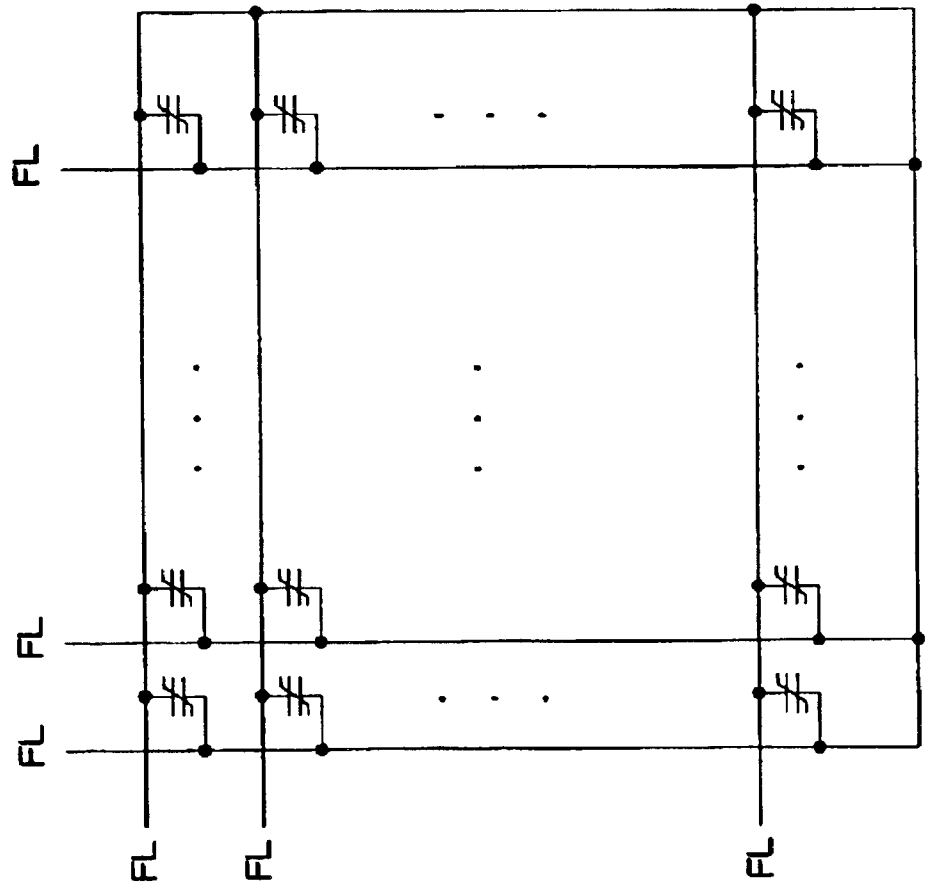
FIG. 5 is an equivalent circuit diagram during a short-circuit operation of the word lines and the bit lines.

After the data read operation, the polarization state at the point C in FIG. 3 must be returned to the original point A or D. A short-circuit operation is performed as a step of returning the polarization state to the point A or D. FIG. 5 is an equivalent circuit diagram of a short-circuit state in which all the short-circuit switches 34 in the short-circuiting circuit 30 shown in FIG. 1 are turned on. The word lines 14 and the bit lines 16 are set in a floating (FL) state at one end connected with each of the drivers 20 and 22.

When all the word lines 14 and the bit lines 16 are short-circuited, charges are transferred from the high potential side to the low potential side, whereby all the word lines 14 and the bit lines 16 are set at the same potential (equalize operation). Since the potentials of all the word lines 14 and the bit lines 16 are equalized by transfer of internal charges in all the word lines 14 and the bit lines 16, power consumption does not occur.

This short-circuit operation causes the voltage applied to the selected bit 18*a* to be 0 V, whereby the polarization state at the point C in FIG. 3 is switched to the polarization state at the point D. Therefore, the selected cell 18*a* in a polarization state at the point D before the read operation can be returned to the original polarization state at the point D. Moreover, since the voltage applied to the nonselected cells 18*b* in a polarization state at one of the points G, H, I, and J in FIG. 3 becomes 0 V, the nonselected cells 18*b* are returned to the polarization state before the read operation at the point A or D.

The polarization of the selected cell 18*a* which is originally in a polarization state at the point A is switched to the point C by the read operation, and switched to the point D by the short-circuit operation. The polarization of the selected cell 18*a* is returned to the point A from the point D through the points E and F by the subsequent rewrite operation and short-circuit operation.

Rewrite Operation

Figure 6:
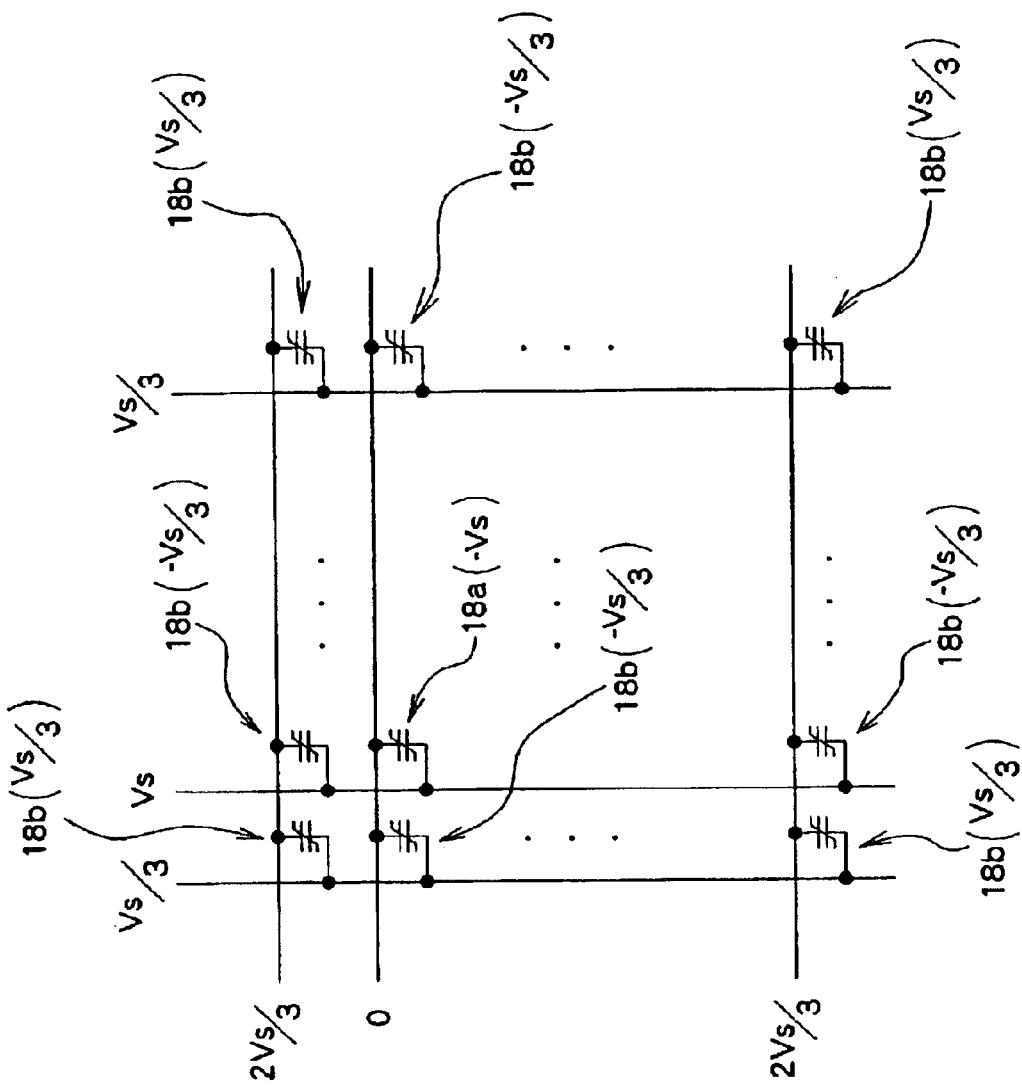
FIG. 6 is a schematic explanatory diagram showing potential setting of the word lines and the bit lines of a ferroelectric memory cell array when rewriting (when writing data "1")

FIG. 6 shows an operation of rewriting the selected cell 18*a* which is originally in a polarization state at the point A after the read operation shown in FIG. 4 and the short-circuit operation shown in FIG. 5. All the short-circuit switches 34 in the short-circuiting circuit 30 shown in FIG. 1 are turned off when rewriting. In FIG. 6, the word select potential of the word line 14 connected with the selected cell 18*a* (cell which is in a polarization state at the point A when reading and switched to a polarization state at the point D when short-circuiting) is the same as the bit select potential (0 V) of the bit line 16 when reading shown in FIG. 4, differing from the reading shown in FIG. 4. The bit select potential of the bit line 16 shown in FIG. 6 is the same as the word select potential (Vs) of the word line 14 when reading shown in FIG. 4.

This rewrite operation causes the voltage −Vs to be applied to the selected cell 18*a*. This rewrite operation is the same as the write operation of data "1". Therefore, the polarization of the selected cell 18*a* is switched from the point D in FIG. 3 to the saturation polarization point F across the inversion point E.

The voltage applied to the nonselected cells 18*b* when rewriting is ±Vs/3 in the same manner as in the reading. As a result, the polarization of the nonselected cells 18*b* in a polarization state at the point A or D is switched to one of the points G, H, I, and J in FIG. 3 in the same manner as in reading. However, stored data is not inverted for the above-described reason.

Short-circuit Operation after Rewrite Operation

The short-circuit operation shown in FIG. 5 is performed after the rewrite operation. Since the voltage applied to the selected bit 18*a* becomes 0 V by the short-circuit operation, the polarization state at the point F in FIG. 3 is switched to the polarization state at the point A. Therefore, the selected cell 18*a* which is in a polarization state at the point A before the read operation can be returned to the original polarization state at the point A. Moreover, since the voltage applied to the nonselected cells 18*b* which are in a polarization state at one of the points G, H, I, and J in FIG. 3 also becomes 0 V, the nonselected cells 18*b* are returned to the polarization state at the point A or D before the read operation. This enables all the ferroelectric memory cells 18 to be returned to the memory state before the read operation.

The potential setting when writing data "1" is the same as the potential setting shown in FIG. 6. Specifically, the polarization of the selected cell 18*a* is switched to the saturation polarization point F in FIG. 3 by applying the voltage −Vs to the selected cell 18*a* by setting the potentials of the word line 14 and the bit line 16 connected with the selected cell 18*a* at 0 V and Vs, respectively. The polarization state at the point A in FIG. 3 (memory state of data "1") can be attained by performing the short-circuit operation shown in FIG. 5.

Generally, data is written in a plurality of cells at the same time by selecting one word line 14. In the present embodiment, the write operation of data "0" (write 0) shown in FIG. 4 and the write operation of data "0" (write 1) shown in FIG. 6 are separately performed. The short-circuit operation is performed between the write 0 operation and the write 1 operation.

Figure 7:
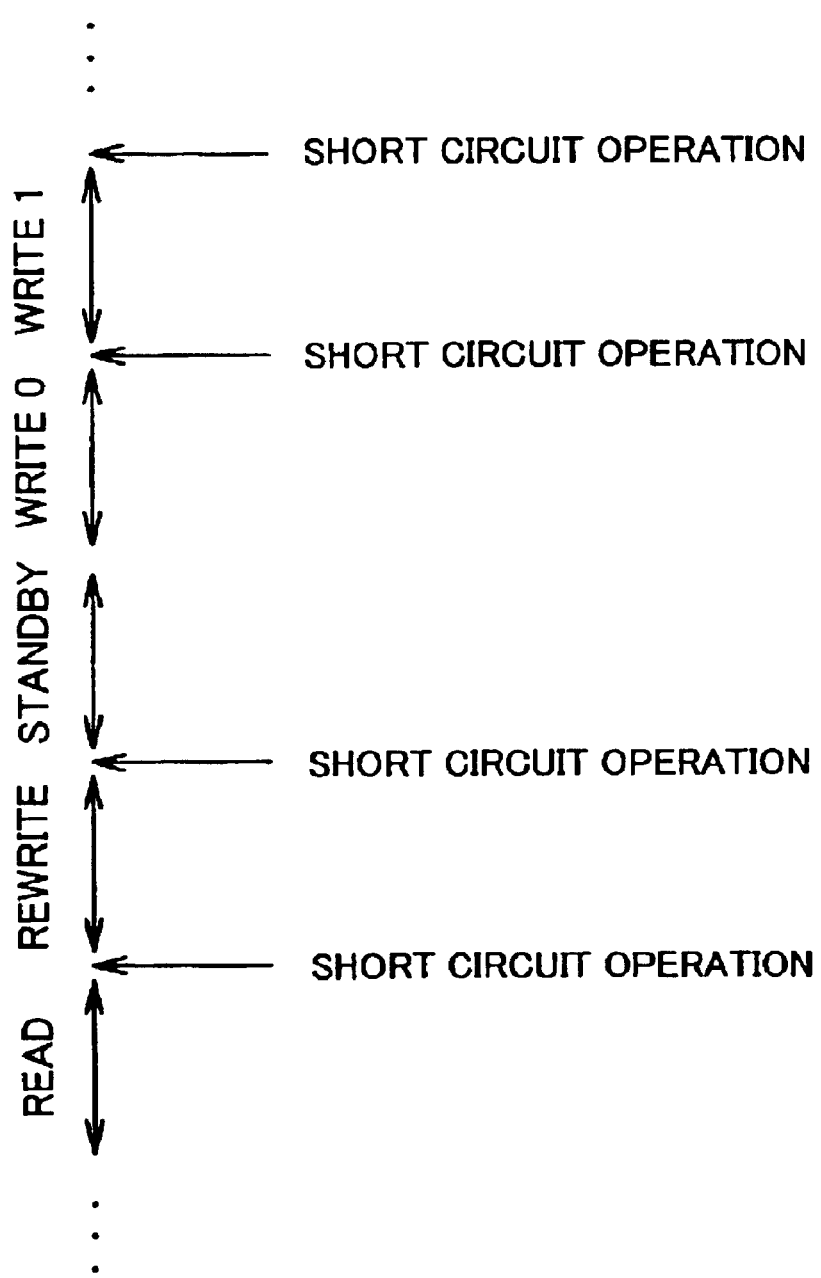
FIG. 7 is a schematic explanatory diagram for describing a short-circuit timing in the first embodiment of the present invention.

FIG. 7 shows a summary of the above operations. As shown in FIG. 7, the short-circuit operation using the short-circuiting circuit 30 is performed after each of the data read operation, the rewrite operation, the write 0 operation, and the write 1 operation. As shown in FIG. 7, the short-circuit operation is unnecessary after a standby state in which data is neither read nor written. This is because the equalized state of the word lines 14 and the bit lines 16 is maintained during the standby state since the short-circuit operation has been performed before switching to the standby state.

Precharge Effect of Short-circuit Operation and the Like

The short-circuit operation has a precharge effect for immediately starting the next operation in addition to the equalize effect by which the voltage applied to the ferroelectric memory cells 18 is set at 0 V in FIG. 3.

From the comparison between the read operation (write 0 operation) shown in FIG. 4 and the rewrite operation (write 1 operation) shown in FIG. 6 performed after the read operation, it is necessary to change the potential of the nonselected word line 14 from Vs/3 to 2Vs/3, the potential of the selected word line 14 from Vs to 0, the potential of the nonselected bit line 16 from 2Vs/3 to Vs/3, and the potential of the selected bit line 16 from 0 to Vs. When the short-circuit operation shown in FIG. 5 is performed between the read operation (write 0 operation) shown in FIG. 4 and the rewrite operation (write 1 operation) shown in FIG. 6, the potentials of all the word lines 14 and the bit lines 16 converge and are precharged at the intermediate potential between 0V and Vs. Therefore, the rise time of the word lines 14 and the bit lines 16 to the potentials set in the next rewrite operation (write 1 operation) can be decreased. Moreover, since this precharge operation can be performed by charging and discharging of all the word lines 14 and the bit lines 16, power consumption does not occur.

The short-circuit operation is realized by only the short-circuiting circuit 30 without passing through the word line driver 20 and bit line driver 22 or the power supply circuit 24. The word lines 14 and the bit lines 16 may be connected in common with the grounding potential in the power supply circuit 24 through the word line driver 20 and the bit line driver 22. In this case, transistors in the word line driver 20 and the bit line driver 22 or the power supply circuit 24 are interposed in the middle of the short-circuit path. This causes charging and discharging to be delayed since an additional load capacitance is connected due to an increase in the length of the short-circuit path. Moreover, the operation becomes unstable since a plurality of stages of transistors are interposed. Therefore, the short-circuit operation cannot be confidently performed, whereby reliability is decreased. In the present embodiment, since the short-circuiting circuit 30 is directly connected with the ends of the word lines 14 and the bit lines 16 and only one stage of the short-circuit switches 34 are turned on, the above-described problems can be eliminated.

Second Embodiment

Figure 8:
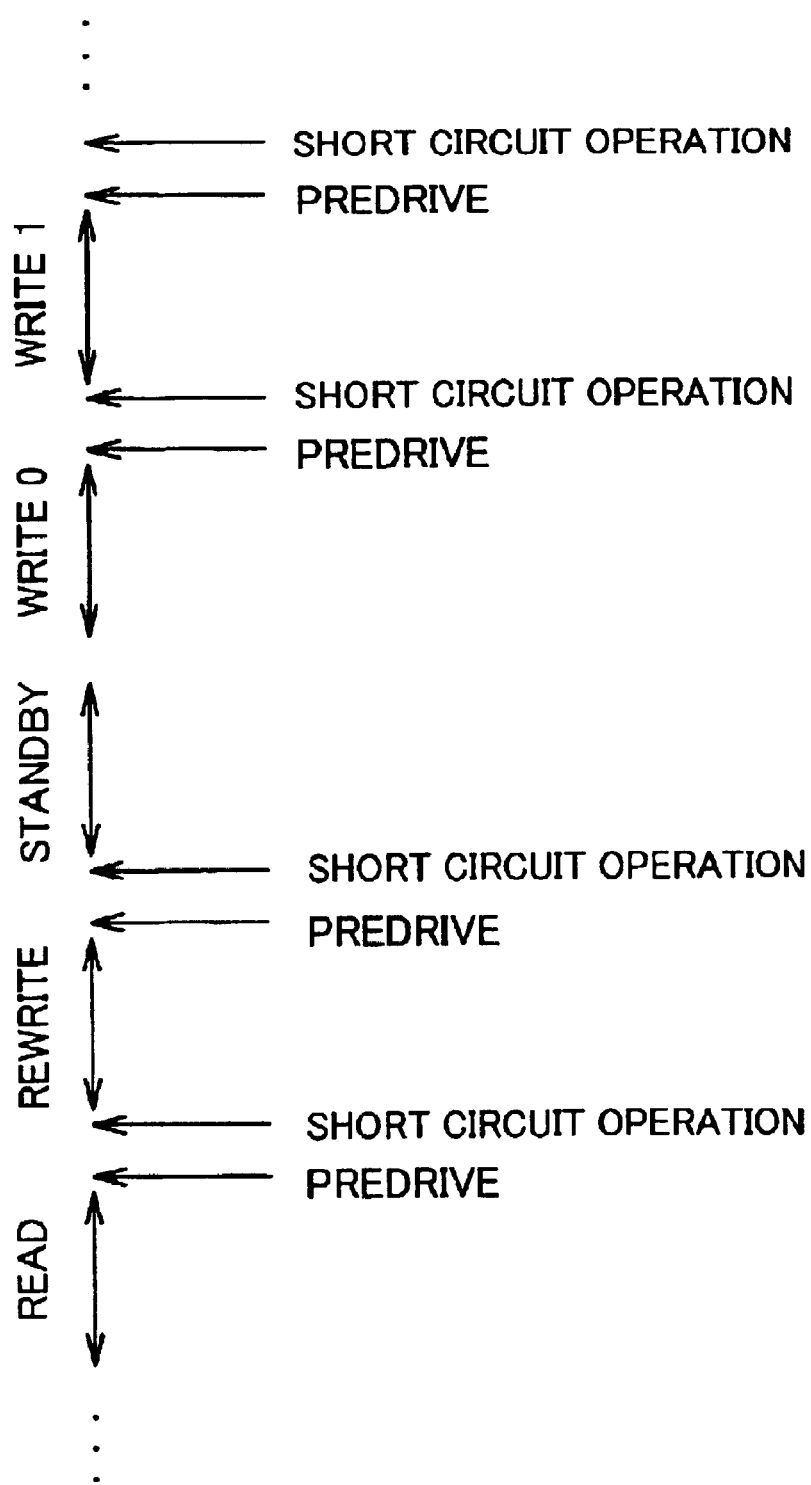
FIG. 8 is a schematic explanatory diagram for describing a predrive timing and a short-circuit timing in a second embodiment of the present invention.

FIG. 8 shows a second embodiment of the present invention in which a predrive operation is performed before the short-circuit operation. In the predrive operation, the word line 14 and the bit line 16 connected with the selected cell 18*a* are predriven at an arbitrary potential between 0 V and Vs by the word line driver 20 and the bit line driver 22 between the read-operation (write 0 operation) shown in FIG. 4 and the short-circuit operation shown in FIG. 5.

If the potential 2Vs/3 or Vs/3 supplied from the power supply circuit 24 is used as a predrive potential, it is unnecessary to additionally provide the predrive potential.

The number of word lines 14 and bit lines 16 connected with the selected cell 18a is significantly smaller than the total number of word lines 14 and bit lines 16 connected with the nonselected cells 18b. Therefore, load capacitance connected with the word line 14 and the bit line 16 connected with the selected cell 18a is small.

If the short-circuit operation shown in FIG. 5 is performed without predriving, it is difficult to estimate the behavior of charge transfer since the charge and discharge speed of the word line 14 and the bit line 16 connected with the selected cell 18a is higher than the charge and discharge speed of the word line 14 and bit line 16 connected with the nonselected cell 18b.

Figure 9:
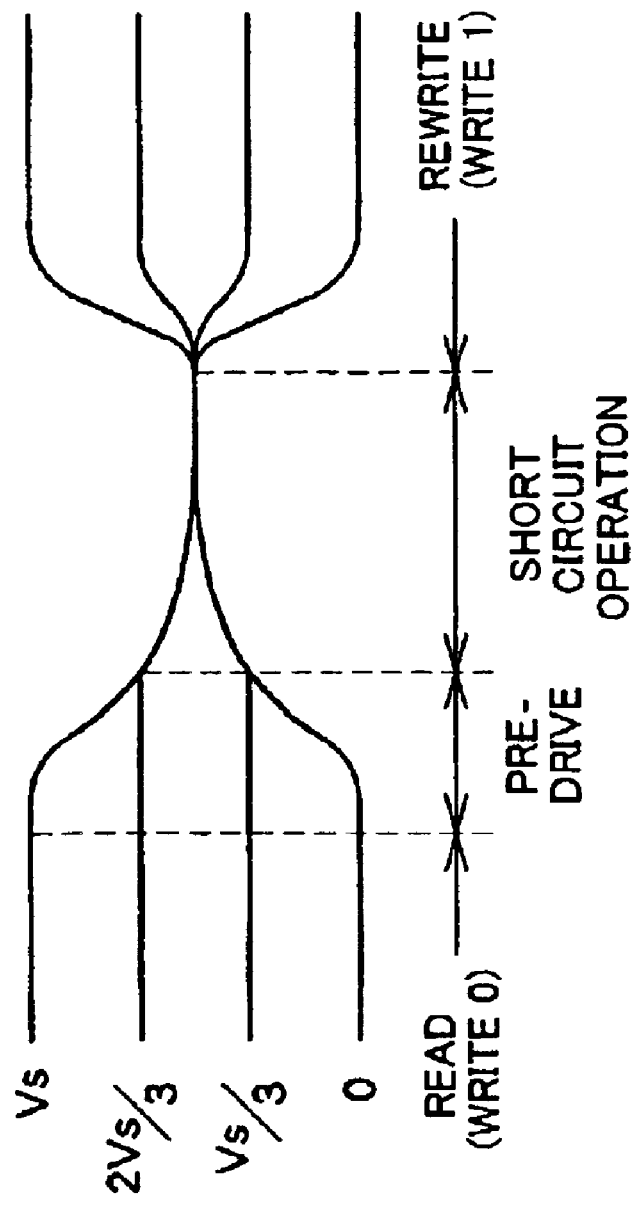
FIG. 9 is a potential transition diagram of word lines and bit lines in the second embodiment of the present invention.

In the second embodiment, the word line 14 (potential Vs in FIG. 4) and the bit line 16 (potential 0 in FIG. 4) connected with the selected cell 18a are predriven so as to be close to the nonselect potential 2Vs/3 or Vs/3, as shown in FIG. 9. This allows the word lines 14 and the bit lines 16 to be charged or discharged in a stable manner during the short-circuit operation, whereby the word lines 14 and the bit lines 16 converge to a predetermined potential.

Third Embodiment

Figure 10:
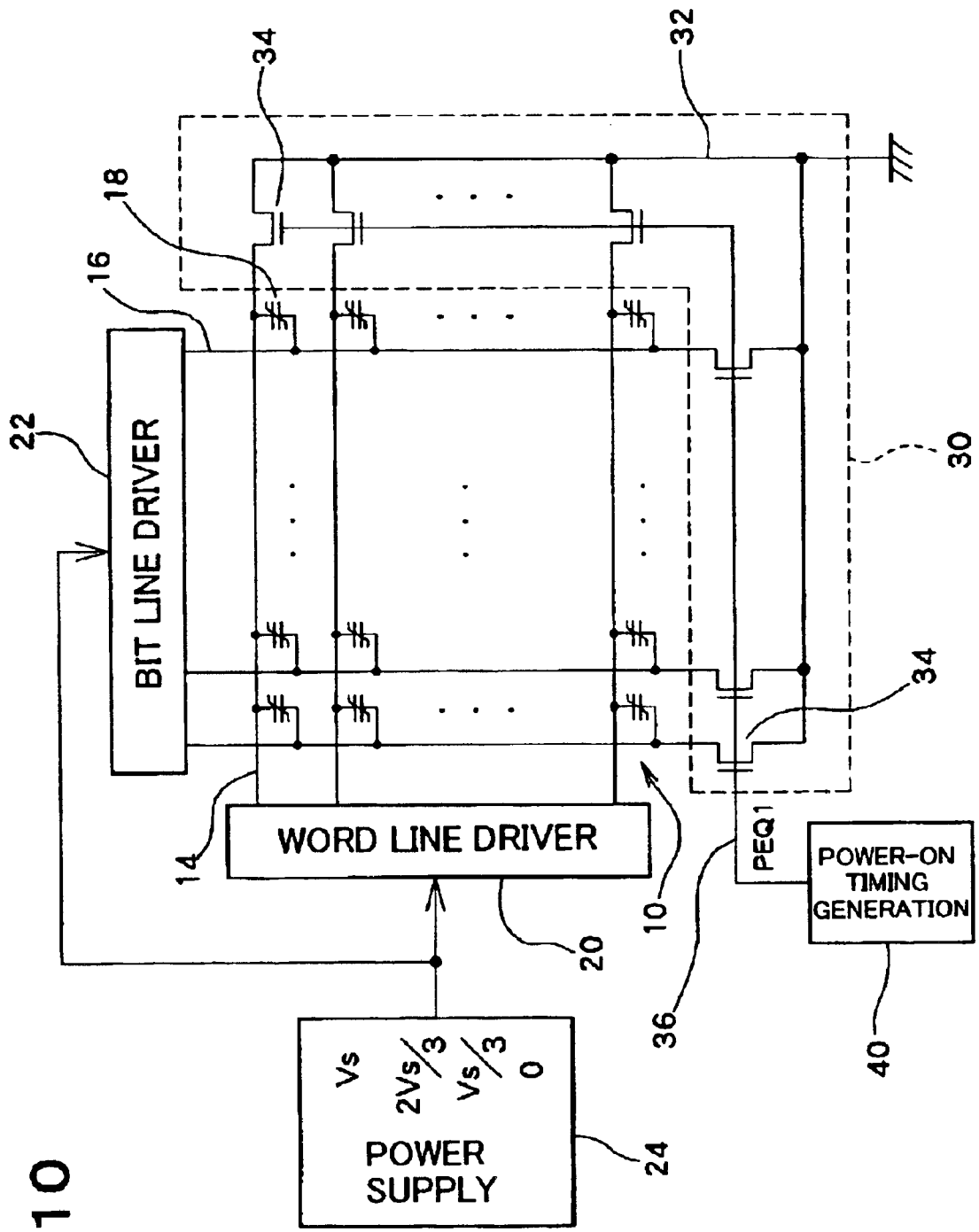
FIG. 10 is a schematic explanatory diagram of a ferroelectric memory device according to a third embodiment of the present invention.

FIG. 10 is a block diagram of a third embodiment of the present invention. A first feature of FIG. 10 differing from FIG. 1 is that the common short-circuit line 32 is grounded. A second feature of FIG. 10 differing from FIG. 1 is that a power-on timing generation circuit 40 is connected with the common gate line 36 of the short-circuit switches 34 instead of supplying the short-circuit timing signal generated during the short-circuit operation shown in FIGS. 7 and 8 to the common gate line 36.

Figure 11:
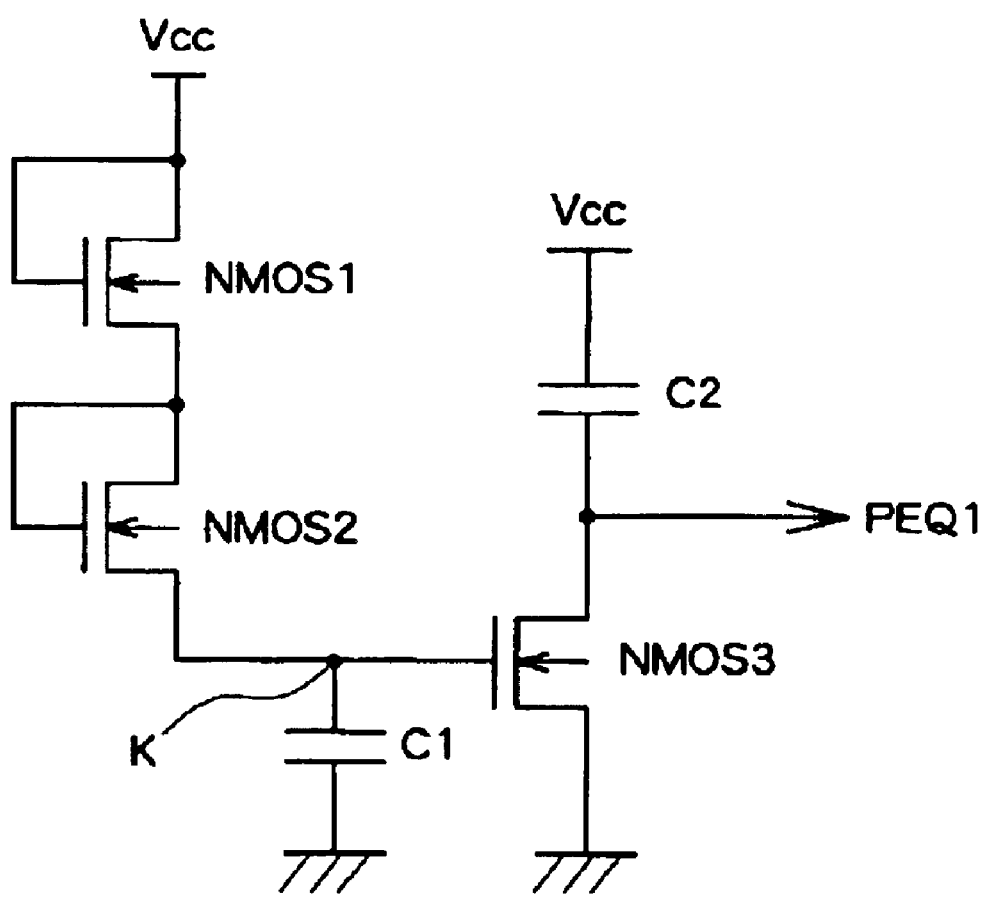
FIG. 11 is a circuit diagram showing an example of a power-on timing generation circuit shown in FIG. 10.
Figure 12:
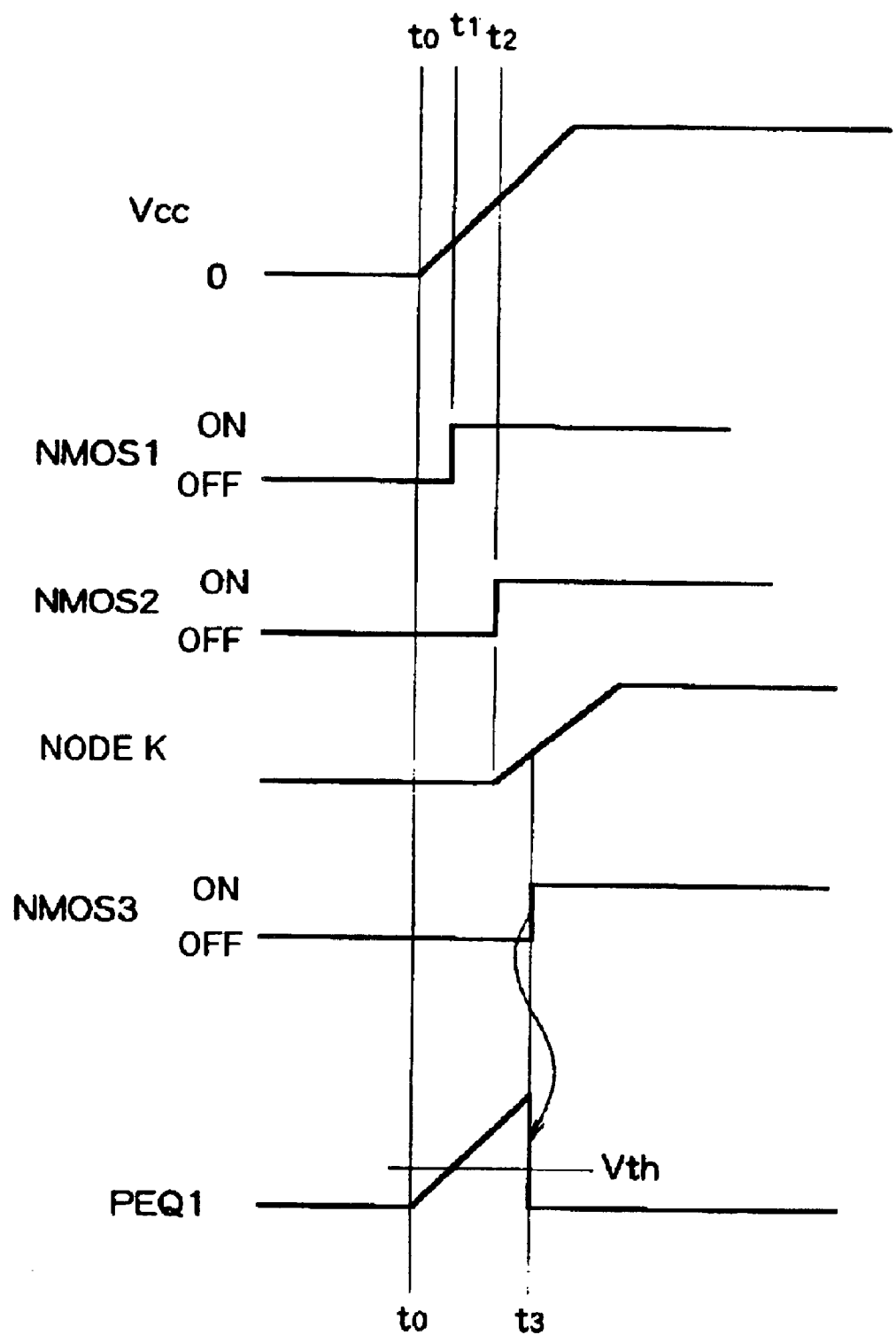
FIG. 12 is an operation timing chart of the power-on timing generation circuit shown in FIG. 11.

FIG. 11 shows an example of the power-on timing generation circuit 40 shown in FIG. 10. FIG. 12 shows an operation timing chart of the power-on timing generation circuit 40. As shown in FIG. 12, the potential of an output PEQ1 of the power-on timing generation circuit 40 is increased in synchronization with the rise of the potential of the power supply voltage Vcc when turning the power on, and becomes equal to or higher than a threshold voltage Vth of the short-circuit transistor 34 of the short-circuiting circuit 30 for a predetermined period. This enables the short-circuit operation in the short-circuiting circuit 30 to be performed immediately after turning the power on. As a result, all the word lines 14 and the bit lines 16 shown in FIG. 1 can be reliably equalized at the grounding potential even if the transistors in the word line driver 20, the bit line driver 22, and the power supply circuit 24 are indeterminate immediately after turning the power on.

In particular, the power supply potential is raised for a comparatively long period of time (ms order, for example) when turning the power on. Therefore, noise superposed on the word lines 14 or the bit lines 16 exceeds the coercive voltage (voltage at the point B or E in FIG. 3) of the ferroelectric capacitor 18 if the noise is superposed for a comparatively long period of time, even if the level of the noise is low. This may cause data to be inverted or the cell to be destroyed when the voltage exceeds the withstand voltage of the cell.

In the present embodiment, the two electrodes of all the ferroelectric memory cells 18 are equalized at the grounding potential, whereby destruction of the memory cells can be prevented and the memory state when turning the power off can be maintained when turning the power on. The common short-circuit line 32 is not necessarily grounded. However, the memory state when turning the power off can be maintained more stably by grounding the common short-circuit line 32.

The operation of the power-on timing generation circuit 40 shown in FIG. 11 is described below with reference to FIG. 12. The power is turned on at a time t0, whereby the power supply voltage Vcc starts to be raised. When the power supply voltage Vcc is raised to a level at which a gate-source voltage of a first N-type MOS transistor (hereinafter abbreviated as "NMOS1") is equal to or higher than the threshold voltage (time t1), the NMOS1 is turned on. When the power supply voltage Vcc is raised to a level at which a gate-source voltage of an NMOS2 is equal to or higher than the threshold voltage (time t2), the NMOS2 is turned on.

A capacitor C1 starts to be charged from the time t2. When the charge voltage of the capacitor C1 is raised to a level at which a gate-source voltage of an NMOS3 is equal to or higher than the threshold voltage Vth (time t3), the NMOS3 is turned on.

Since a capacitor C2 starts to be charged when turning the power on (time t0), the potential of the signal PEQ1 is raised in the same manner as the capacitor C2. When the NMOS3 is turned on at the time t3, the signal PEQ1 is grounded (0 V). As shown in FIG. 12, since the signal PEQ1 is maintained at a potential higher than the threshold voltage Vth of the short-circuit switches 34 shown in FIG. 10 for a predetermined period immediately after turning the power on, the short-circuit operation in the short-circuiting circuit 30 can be realized immediately after turning the power on.

As a specific circuit of the power-on timing generation circuit 40, various types of circuits may be employed. It suffices that the power-on timing generation circuit 40 be capable of generating a signal of which the potential is raised in synchronization in time and potential with the rise of the potential of the power supply voltage Vcc when turning on the power supply voltage Vcc and which causes the short-circuit switches 34 to be turned on for a predetermined period. For example, if the number of transistors connected in series with the first and second N-type MOS transistors NMOS1 and NMOS2 is increased in the circuit shown in FIG. 11, a charge start timing of the capacitor C2 shown in FIG. 12 can be delayed. This enables the period in which the short-circuit switches 34 are turned on by the signal PEQ1 to be increased.

Fourth Embodiment

Figure 13:
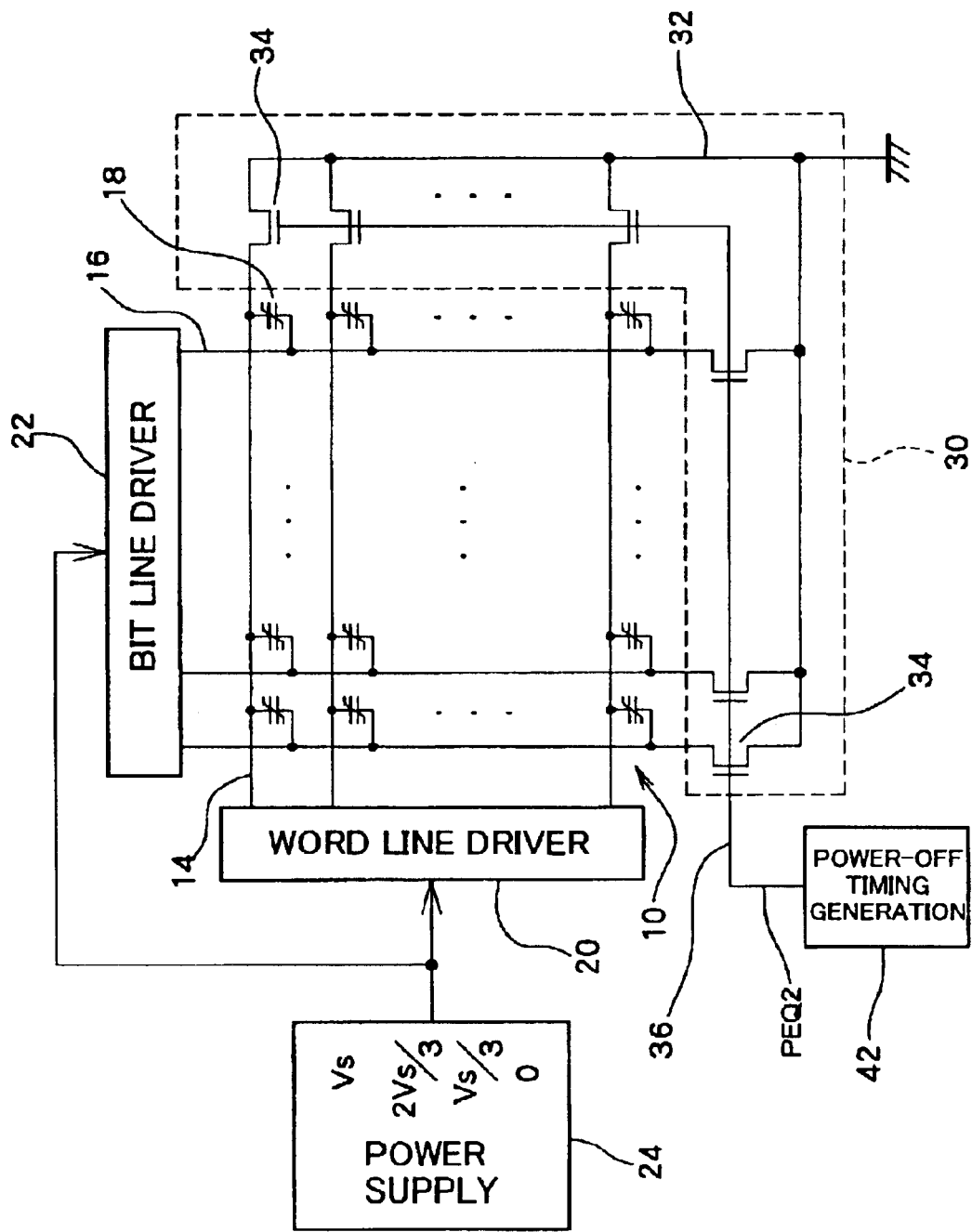
FIG. 13 is a schematic explanatory diagram of a ferroelectric memory device according to a fourth embodiment of the present invention.

FIG. 13 shows a fourth embodiment of the present invention in which a power-off timing generation circuit 42 is provided in place of the power-on timing generation circuit 40 shown in FIG. 10.

Figure 14:
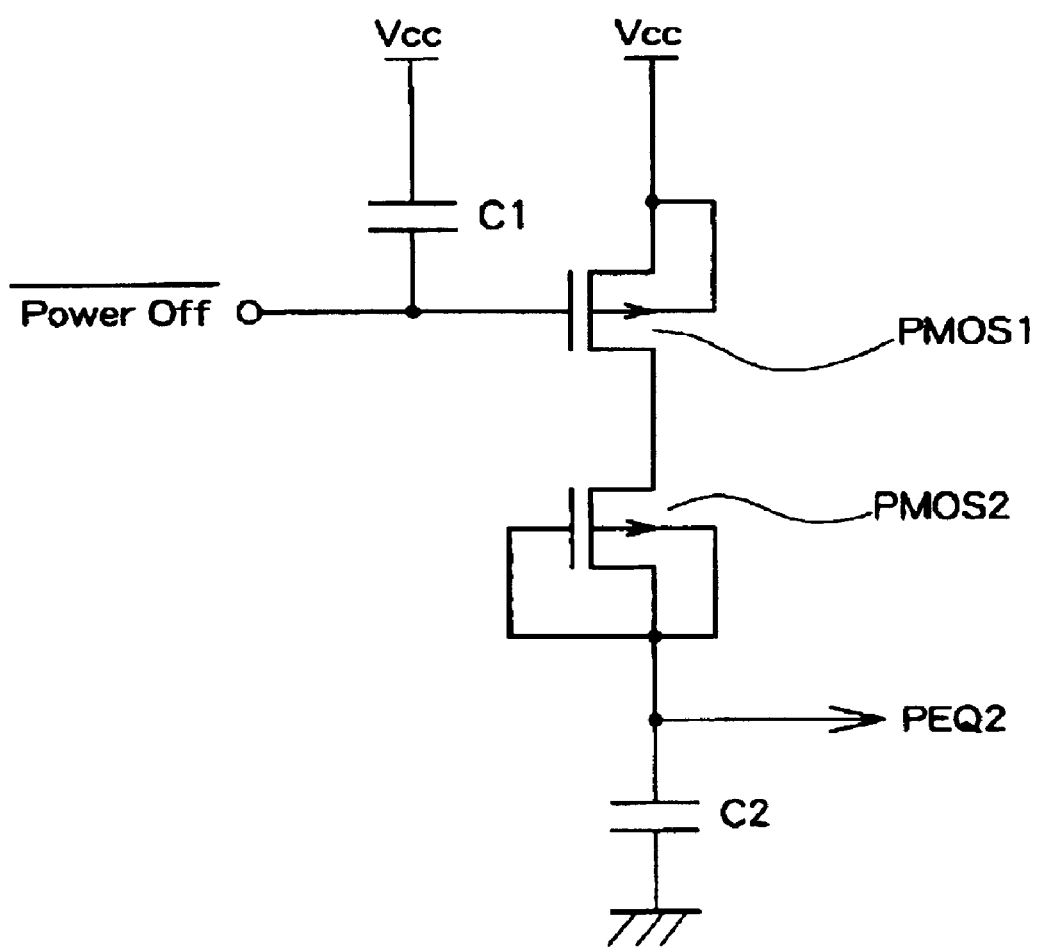
FIG. 14 is a circuit diagram showing an example of a power-off timing generation circuit shown in FIG. 13.
Figure 15:
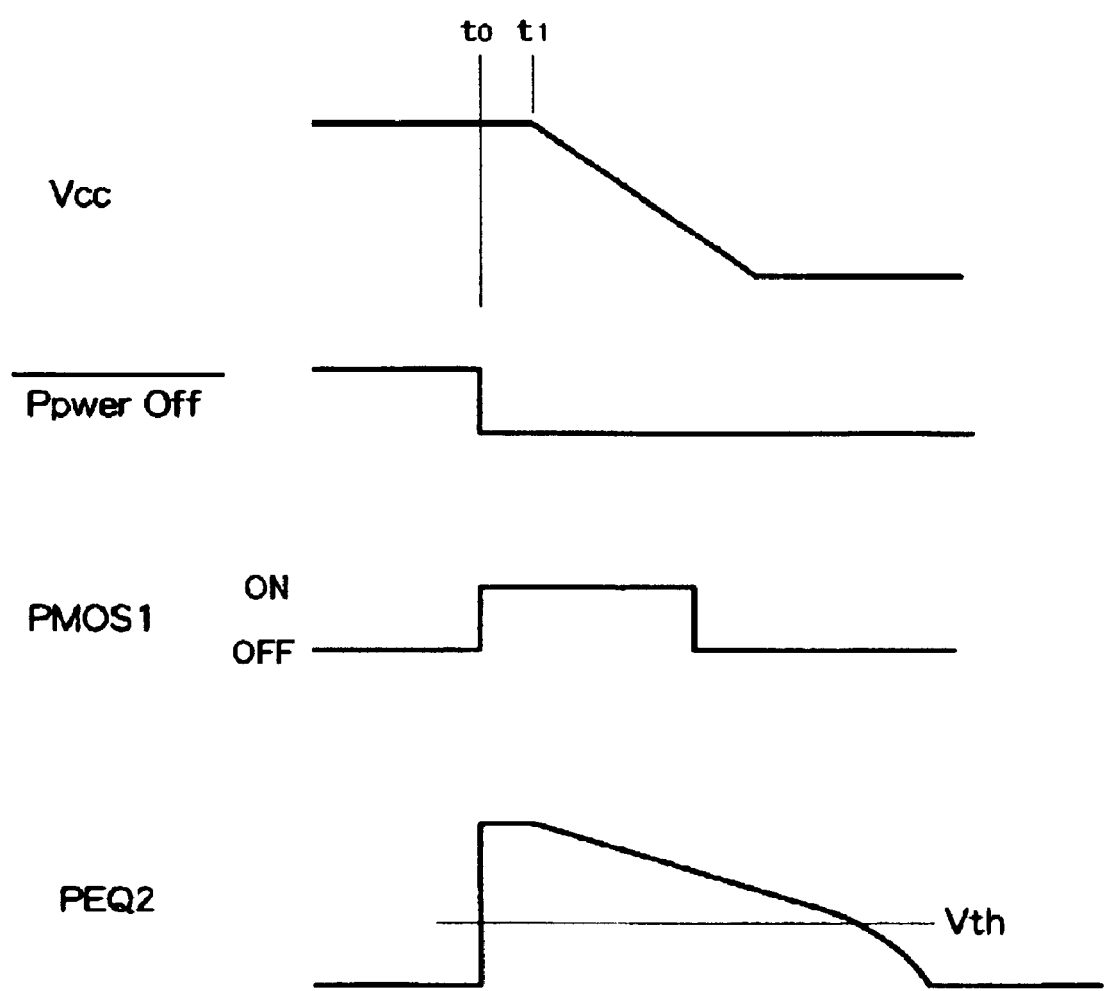
FIG. 15 is an operation timing chart of the power-off timing generation circuit shown in FIG. 14.

FIG. 14 shows an example of the power-off timing generation circuit 42 shown in FIG. 13. FIG. 15 shows an operation timing chart of the power-off timing generation circuit 42. As shown in FIG. 15, an output PEQ2 of the power-off timing generation circuit 42 is raised in synchronization with power-off of the power supply voltage Vcc (falling edge t0 of a power-off signal in FIG. 15), and becomes equal to or higher than the threshold voltage Vth of the N-type MOS transistors which make up the short-circuit switches 34 of the short-circuiting circuit 30 for a predetermined period even after the power supply voltage Vcc becomes 0 V. This enables the short-circuit operation in the short-circuiting circuit 30 to be performed even when turning the power off. As a result, all the word lines 14 and the bit lines 16 shown in FIG. 1 can reliably equalized at the grounding potential even if the transistors in the word line driver 20, the bit line driver 22, and the power supply circuit 24 are indeterminate when turning the power off. Therefore, the two electrodes of the ferroelectric memory cells 18 are equalized at the grounding potential, whereby the memory state can be maintained when turning the power off. The common short-circuit line 32 is not necessarily grounded. However, the memory state can be maintained more stably when turning the power off by grounding the common short-circuit line 32.

The operation of the power-off timing generation circuit 42 shown in FIG. 14 is described below with reference to FIG. 15. Before a time t0, a first PMOS transistor (hereinafter abbreviated as "PMOS1") is turned off by the power-off signal (HIGH), and the signal PEQ2 is at the grounding potential through the capacitor C2. When the power-off signal goes active (LOW) at the time t0, the first PMOS transistor PMOS1 is turned on. This causes current to flow through a diode-connected second PMOS transistor PMOS2 in the forward direction, whereby the capacitor C2 starts to be charged and the signal PEQ2 is raised at the power supply voltage Vcc. This allows the short-circuit switches 34 in the short-circuiting circuit 30 shown in FIG. 13 to be turned on before the power supply voltage Vcc starts to drop. When the power supply voltage Vcc starts to drop at the time t1, voltage in the reverse direction is applied between a gate and a source of the diode connected second PMOS transistor PMOS2, whereby current does not flow through the second PMOS transistor PMOS2. Therefore, the potential of the signal PEQ2 is set by the charges stored in the capacitor C2, and the potential of the signal PEQ2 slowly drops as the stored charges are discharged. As shown in FIG. 15, since the signal PEQ2 is maintained at a potential higher than the threshold voltage Vth of the short-circuit switches 34 shown in FIG. 13 for a predetermined period before and after the power is turned off, the short-circuit operation in the short-circuiting circuit 30 can be realized immediately after turning the power off.

As a specific circuit of the power-off timing generation circuit 42, various types of circuits may be employed. It suffices that the power-off timing generation circuit 40 be capable of generating a signal which causes the short-circuit switches 34 to be turned on for a predetermined period even after the power supply voltage Vcc is turned off. For example, a signal which goes active when the potential of the power supply voltage Vcc starts to drop by monitoring the power supply voltage Vcc may be used in place of the power-off signal which goes active before the potential of the power supply voltage Vcc drops as shown in FIG. 15.

Fifth Embodiment

Figure 16:
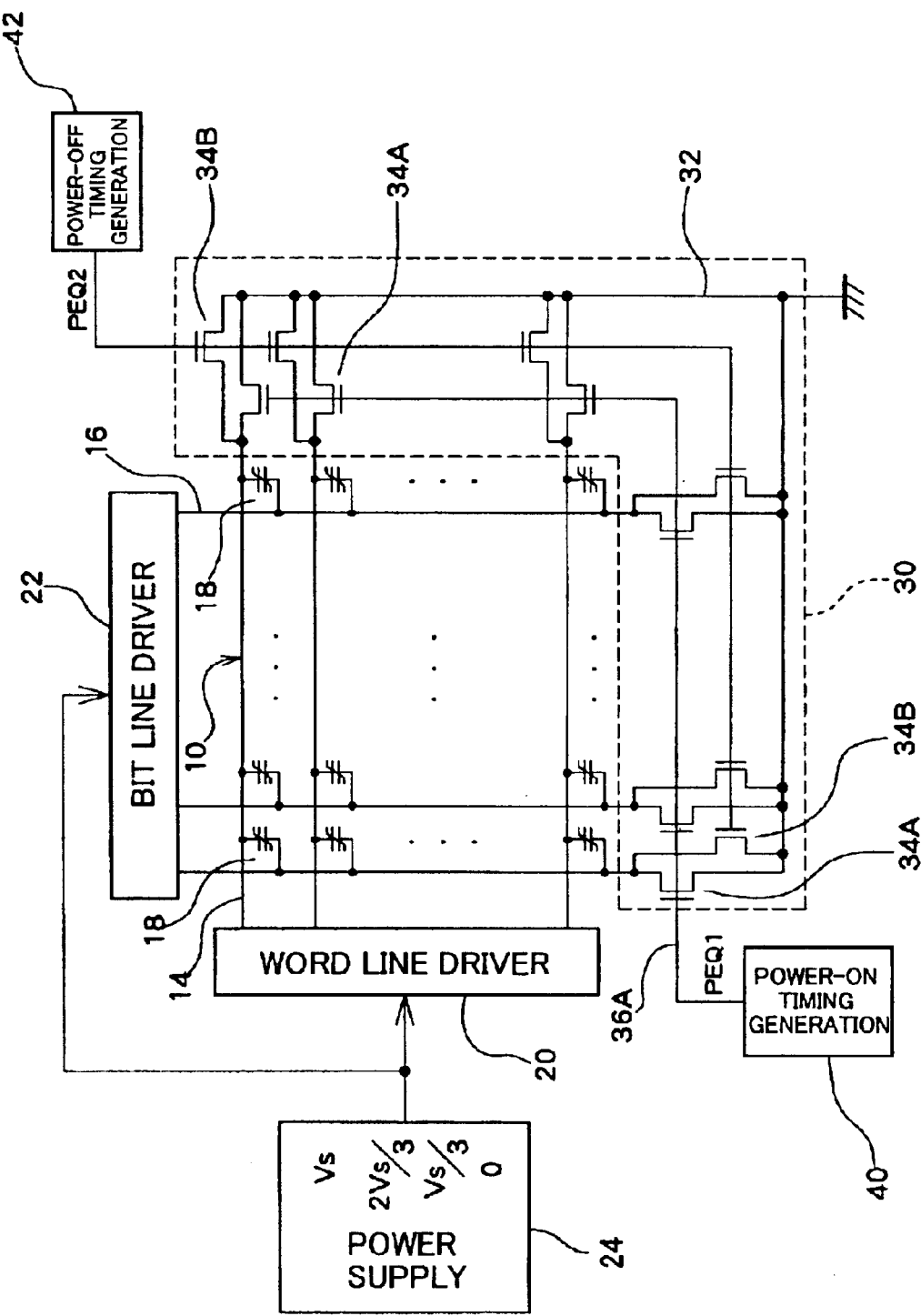
FIG. 16 is a schematic explanatory diagram of a ferroelectric memory device according to a fifth embodiment of the present invention.

FIG. 16 is a block diagram of a fifth embodiment of the present invention in which both the power-on timing generation circuit 40 shown in FIG. 10 and the power-off timing generation circuit 42 shown in FIG. 13 are provided. In FIG. 16, the short-circuiting circuit 30 has first short-circuit switches (NMOS) 34A connected between the end of each of the word lines 14 and the bit lines 16 and the common short-circuit line 32. The power-on timing generation circuit 40 is connected with a common gate line 36A of the first short-circuit switches 34A. Second short-circuit switches 34B are respectively connected in parallel with the first short-circuit switches. The power-off timing generation circuit 42 is connected with a common gate line 36B of the second short-circuit switches 34B. According to this configuration, the first short-circuit switches 34A are turned on when turning the power on, and the second short-circuit switches 34B are turned on when turning the power off. This enables the word lines 14 and the bit lines 16 to be reliably equalized when turning the power on or off by operating the short-circuiting circuit 30. The common short-circuit line 32 shown in FIG. 16 is grounded. However, the common short-circuit line 32 is not necessarily grounded.

Sixth Embodiment

Figure 17:
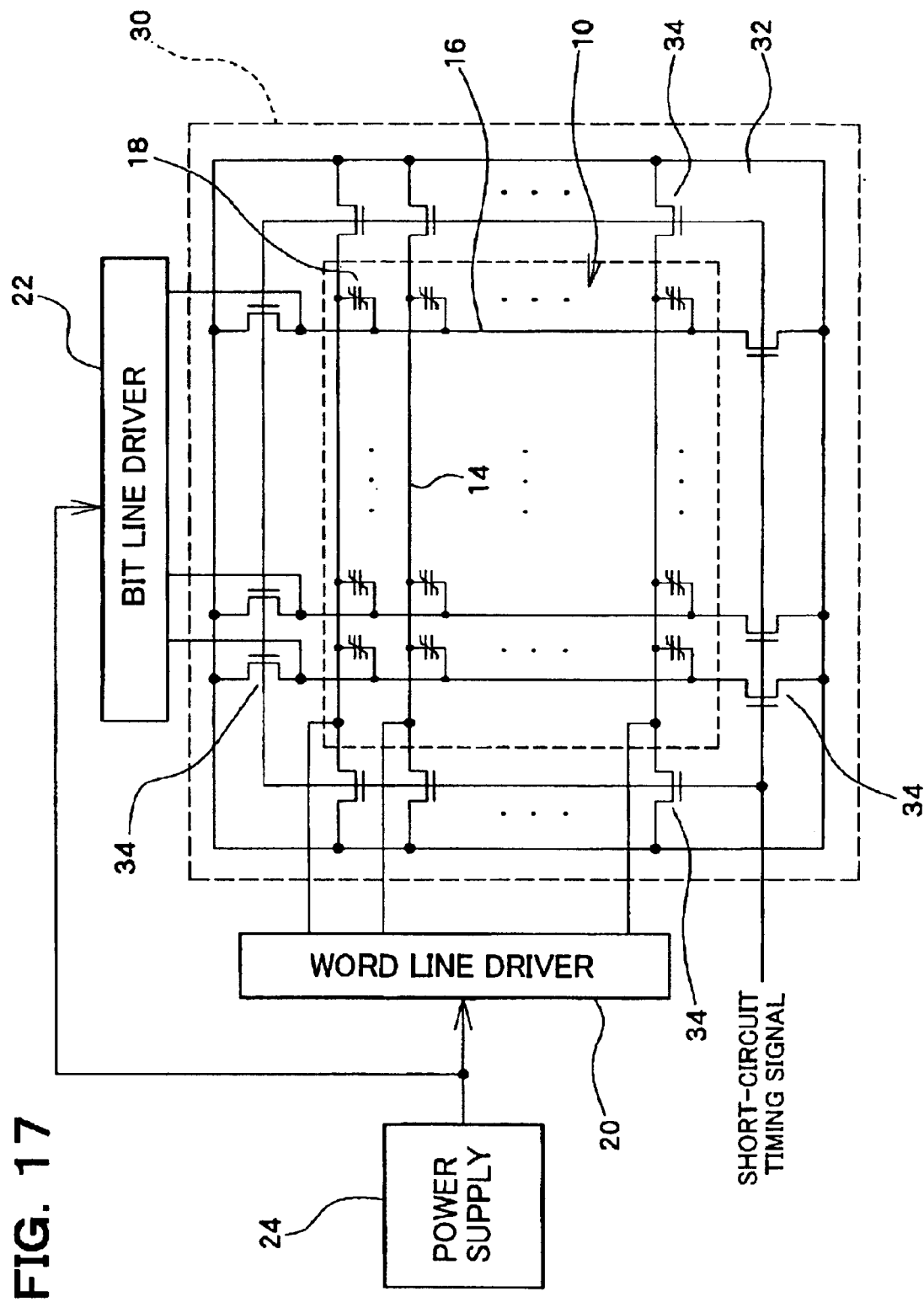
FIG. 17 is a schematic explanatory diagram of a ferroelectric memory device according to a sixth embodiment of the present invention.

FIG. 17 is a schematic explanatory diagram showing a sixth embodiment of the present invention. In FIG. 17, the short-circuit switches 34 are provided between the opposite ends of each of the word lines 14 and the bit lines 16 and the common short-circuit line 32 disposed in the shape of a ring. This enables the speed of the equalize operation due to charging and discharging of the word lines 14 and the bit lines 16 when the short-circuit switches 34 are turned on to be increased. The second to fifth embodiments of the present invention may also be applied to the sixth embodiment shown in FIG. 17.

The present invention is not limited to the above-described embodiments. Various modifications and variations are possible within the spirit and scope of the present invention.

What is claimed is:

1. A ferroelectric memory device comprising:
   a plurality of word lines disposed in parallel;
   a plurality of bit lines disposed in parallel so as to intersect the word lines;
   a plurality of ferroelectric memory cells disposed at intersecting points of the word lines and the bit lines;
   a word line driver section which drives the word lines;
   a bit line driver section which drives the bit lines;
   a first circuit which supplies a plurality of types of drive voltages to the word line driver section and the bit line driver section; and
   a second circuit which is connected with end portions of the word lines and end portions of the bit lines, the second circuit short-circuiting all of the word lines and the bit lines.

2. The ferroelectric memory device as defined in claim 1, wherein a memory cell array in which the ferroelectric memory cells are arranged is divided into a plurality of blocks, the word line driver section, the bit line driver section, and the second circuit being disposed in each of the blocks.

3. The ferroelectric memory device as defined in claim 1, wherein the word line driver section is connected with one end portion of each of the word lines and the bit line driver section is connected with one end portion of each of the bit lines, and
   wherein the second circuit is connected with the other end portion of each of the word lines and the other end portion of each of the bit lines.

4. The ferroelectric memory device as defined in claim 1, wherein the word line driver section is connected with one end portion of each of the word lines and the bit line driver section is connected with one end portion of each of the bit lines, and
   wherein the second circuit is connected with opposite two end portions of each of the word lines and opposite two end portions of each of the bit lines.

5. The ferroelectric memory device as defined in claim 1, wherein the second circuit includes:
   a common short-circuit line; and
   a plurality of short-circuit switches each connected between the common short-circuit line and one of among the word lines and the bit lines.

6. The ferroelectric memory device as defined in claim 5,
wherein the second circuit short-circuits all of the word lines and the bit lines by causing the short-circuit switches to be turned on after one of drive modes including reading, rewriting, and writing of data is performed for at least one selected cell of the ferroelectric memory cells.

7. The ferroelectric memory device as defined in claim 6,
wherein the word line driver section drives the word lines by supplying a word select potential to one of the word lines and a word nonselect potential to the other word lines in the drive mode, wherein the bit line driver section drives the bit lines by supplying a bit select potential to at least one of the bit lines and a bit nonselect potential to the other bit lines in the drive mode, and wherein the word line driver section and the bit line driver section predrive potentials of the selected word line and the selected bit line so that the potentials of the selected word line and the selected bit line are between the word select potential and the bit select potential after the drive mode but before all of the word lines and the bit lines are short-circuited by the second circuit.

8. The ferroelectric memory device as defined in claim 5,
wherein the second circuit short-circuits all of the words lines and the bit lines by causing the short-circuit switches to be turned on after a drive mode, in which data is written, in at least one selected cell of the ferroelectric memory cells.

9. The ferroelectric memory device as defined in claim 8,
wherein the word line driver section drives the word lines by supplying a word select potential to one of the word lines and a word nonselect potential to the other word lines in the drive mode, wherein the bit line driver section drives the bit lines by supplying a bit select potential to at least one of the bit lines and a bit nonselect potential to the other bit lines in the drive mode, and wherein the word line driver section and the bit line driver section predrive potentials of the selected word line and the selected bit line so that the potentials of the selected word line and the selected bit line are between the word select potential and the bit select potential after the drive mode but before all of the word lines and the bit lines are short-circuited by the second circuit.

10. The ferroelectric memory device as defined in claim 5, further comprising:
a control signal generating section which generates a control signal which causes the short-circuit switches to be turned on for a predetermined period in rise of a power supply potential immediately after turning power on.

11. The ferroelectric memory device as defined in claim 10, wherein the common short-circuit line is grounded.

12. The ferroelectric memory device as defined in claim 5, further comprising:
a control signal generating section which generates a control signal which causes the short-circuit switches to be turned on, when turning power off, for a predetermined period including a period after the power is turned off.

13. The ferroelectric memory device as defined in claim 12, wherein the common short-circuit line is grounded.

14. The ferroelectric memory device as defined in claim 1,
wherein the second circuit includes:
a common short circuit line;
a plurality of first short-circuit switches each connected between the common short circuit line and one of among the word lines and the bit lines;
a plurality of second short-circuit switches respectively connected in parallel with the first short-circuit switches;
a first control signal generating section which generates a first control signal which causes the first short-circuit switches to be turned on for a predetermined period in rise of a power supply potential immediately after turning power on; and
a second control signal generating section which generates a second control signal which causes the second short-circuit switches to be turned on, when turning power off, for a predetermined period including a period after the power is turned off.

15. The ferroelectric memory device as defined in claim 14, wherein the common short-circuit line is grounded.

16. The ferroelectric memory device as defined in claim 1,
wherein each of the ferroelectric memory cells is formed by only a ferroelectric capacitor.

* * * * *